United States Patent
Nakamura et al.

(10) Patent No.: US 9,416,948 B2
(45) Date of Patent: Aug. 16, 2016

(54) LIGHT-EMITTING MODULE AND LIGHTING APPARATUS

(71) Applicant: Panasonic Corporation, Osaka (JP)

(72) Inventors: Kyohei Nakamura, Kyoto (JP); Yuuya Yamamoto, Osaka (JP); Tadashi Murakami, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/337,348

(22) Filed: Jul. 22, 2014

(65) Prior Publication Data
US 2015/0029712 A1 Jan. 29, 2015

(30) Foreign Application Priority Data
Jul. 26, 2013 (JP) .................................. 2013-156179

(51) Int. Cl.
| | |
|---|---|
| *F21V 19/00* | (2006.01) |
| *F21V 31/04* | (2006.01) |
| *F21K 99/00* | (2016.01) |
| *H01L 25/075* | (2006.01) |
| *F21V 9/00* | (2015.01) |
| *F21Y 105/00* | (2016.01) |
| *F21S 8/02* | (2006.01) |
| *F21Y 101/02* | (2006.01) |
| *H01L 33/50* | (2010.01) |

(52) U.S. Cl.
CPC .............. *F21V 19/0015* (2013.01); *F21K 9/56* (2013.01); *F21V 31/04* (2013.01); *H01L 25/0753* (2013.01); *F21S 8/026* (2013.01); *F21Y 2101/02* (2013.01); *F21Y 2105/003* (2013.01); *H01L 33/508* (2013.01); *H01L 2224/48091* (2013.01); *H01L 2224/49107* (2013.01); *H01L 2224/73265* (2013.01); *H01L 2924/181* (2013.01)

(58) Field of Classification Search
CPC .................... F21Y 2113/002; F21Y 2113/005; F21Y 2105/001; F21Y 2105/003
USPC ......................................................... 362/231
See application file for complete search history.

(56) References Cited

U.S. PATENT DOCUMENTS

| | | |
|---|---|---|
| 8,009,247 B2 | 8/2011 | Oku et al. |
| 8,760,536 B2 | 6/2014 | Oyabu et al. |
| 8,764,223 B2 | 7/2014 | Tsukitani et al. |
| 2002/0181231 A1* | 12/2002 | Luk .............................. 362/240 |

(Continued)

FOREIGN PATENT DOCUMENTS

| | | |
|---|---|---|
| JP | 3204294 | 6/2001 |
| JP | 5050498 | 6/2008 |
| JP | 2011-176017 | 9/2011 |

*Primary Examiner* — Peggy Neils
*Assistant Examiner* — William N Harris
(74) *Attorney, Agent, or Firm* — Greenblum & Bernstein P.L.C.

(57) ABSTRACT

A light-emitting module includes: a board; and a plurality of light sources arranged in a two-dimensional array on the board and including a plurality of color temperatures. In a first direction of the two-dimensional array, light sources having a uniform color temperature are successively arranged. The number of light sources having a uniform color temperature and successively arranged in each array line in the first direction is less than or equal to half of the total number of light sources in the array line in the first direction.

12 Claims, 9 Drawing Sheets

(56) References Cited

U.S. PATENT DOCUMENTS

| | | | |
|---|---|---|---|
| 2007/0014098 A1* | 1/2007 | Park et al. | 362/29 |
| 2008/0117356 A1 | 5/2008 | Oku et al. | |
| 2009/0109668 A1* | 4/2009 | Isobe | 362/231 |
| 2012/0293993 A1* | 11/2012 | Pan et al. | 362/231 |
| 2013/0077299 A1* | 3/2013 | Hussell et al. | 362/231 |
| 2013/0229113 A1 | 9/2013 | Toda et al. | |
| 2013/0265757 A1* | 10/2013 | Tanaka et al. | B60Q 1/04 362/235 |
| 2014/0008630 A1 | 1/2014 | Tsuji et al. | |
| 2014/0014933 A1 | 1/2014 | Sasaki et al. | |
| 2014/0177217 A1 | 6/2014 | Ogata et al. | |
| 2014/0203729 A1* | 7/2014 | Van De Ven | 315/294 |

* cited by examiner

LIGHT-EMITTING MODULE AND LIGHTING APPARATUS

CROSS REFERENCE TO RELATED APPLICATION

This application claims the benefit of priority of Japanese Patent Application Number 2013-156179, filed Jul. 26, 2013, the entire content of which is hereby incorporated by reference.

TECHNICAL FIELD

The disclosure relates to light-emitting modules and lighting apparatuses including the light-emitting modules.

BACKGROUND ART

Semiconductor light-emitting elements, such as light-emitting diodes (LEDs), have been widely used in various apparatuses as high efficiency and space-saving light sources. For example, LEDs are used in lighting appliances, such as a recessed light or a spot light installed in a ceiling, or a bulb-shaped lamp and a straight tube lamp substitute for fluorescent and incandescent bulbs. In this case, LEDs are unitized as a LED module (light-emitting apparatus) and included in a lighting appliance (lighting fixture).

One example of the LED module is a light-emitting apparatus with a chip on board (COB) structure where a plurality of LED chips are directly mounted on a board. Another example is a light-emitting apparatus with a surface mount device (SMD) structure where a plurality of packaged LED chips serving as LED elements are mounted on a board.

For example, Japanese Unexamined Patent Application Publication No. 2011-176017 (hereinafter, referred to as PTL1) discloses a COB light-emitting module. The light-emitting module disclosed in PTL 1 includes one or more line light sources. Each of the line light sources include a plurality of LED chips (LED element group) arranged in a line on an elongated board and a sealing component (a phosphor-containing resin) formed in a line to collectively seal the LED chips.

SUMMARY

Recent years have seen advancement in development of LED modules which allow color adjustment. For example, one LED module may include two kinds of LED elements having different color temperatures. More specifically, a plurality of line light sources having different color temperatures are provided on one board, so that each line source with a color temperature is independently driven to adjust color.

The LED module including the line light sources, however, is likely to have color unevenness. In particular, providing, in an LED module with line light sources, an optical component for focusing light, causes ring-shaped color unevenness on the light-illuminated surface.

The present disclosure has been conceived to solve such a problem, and has an object to provide a light-emitting module and a lighting apparatus which have reduced color unevenness.

In order to solve the above object, a light-emitting module according to one aspect of the present invention is a light-emitting module. The light-emitting module includes: a board; and a plurality of light sources arranged in a two-dimensional array on the board and having a plurality of color temperatures. Among the plurality of light sources, light sources having a uniform color temperature are successively arranged in a first direction of the two-dimensional array. The number of the light sources having a uniform color temperature and successively arranged in each array line in the first direction is less than or equal to a half of a total number of light sources arranged in the each array line in the first direction.

Moreover, in the light-emitting module according to one aspect of the present invention, it may be that the number of light sources having a uniform color temperature and successively arranged in each array line in a second direction of the two-dimensional array is less than or equal to a half of a total number of light sources arranged in the each array line in the second direction. It may be that the second direction is perpendicular to the first direction.

Moreover, in the light-emitting module according to one aspect of the present invention, it may be that among the plurality of light sources, three or more light sources having a uniform color temperature are successively arranged only in the first direction.

Moreover, in the light-emitting module according to one aspect of the present invention, it may be that the number of the light sources having a uniform color temperature and successively arranged in each of the first direction and in the second direction is at most two.

Moreover, in the light-emitting module according to one aspect of the present invention, it may be that each of the plurality of light sources includes: a solid-state light-emitting element mounted at an intersection between a vertical direction and a horizontal direction of the two-dimensional array; and a sealing component which seals the solid-state light-emitting element and includes a wavelength converting material for converting a wavelength of light emitted from the solid-state light-emitting element.

Moreover, in the light-emitting module according to one aspect of the present invention, it may be that the sealing component is provided at the intersection in one-to-one correspondence with the solid-state light-emitting element.

Moreover, in the light-emitting module according to one aspect of the present invention, it may be that the solid-state light-emitting device is mounted at a portion other than a center of a light-emitting region, the light-emitting region being an entire region including all of the plurality of light sources.

Moreover, in the light-emitting module according to one aspect of the present invention, it may be that the light-emitting module further includes a lens for focusing light emitted from the plurality of light sources. It may be that none of the plurality of light sources is arranged at a focal point of the lens on the board.

Moreover, in the light-emitting module according to one aspect of the present invention, it may be that the light-emitting module further includes a plurality of electrical lines for connecting light sources that have a uniform color temperature and belong to different array lines. It may be that the electrical lines are inclined in a same direction in a planar view of the board.

A lighting apparatus according to one aspect of the present invention includes any one of the above light-emitting modules.

According to an aspect of the present invention, it is possible to achieve a light-emitting module and a lighting apparatus which have reduced color unevenness.

BRIEF DESCRIPTION OF THE DRAWINGS

The figures depict one or more implementations in accordance with the present teaching, by way of examples only, not by way of limitations. In the figures, like reference numerals refer to the same or similar elements.

Figure 3:
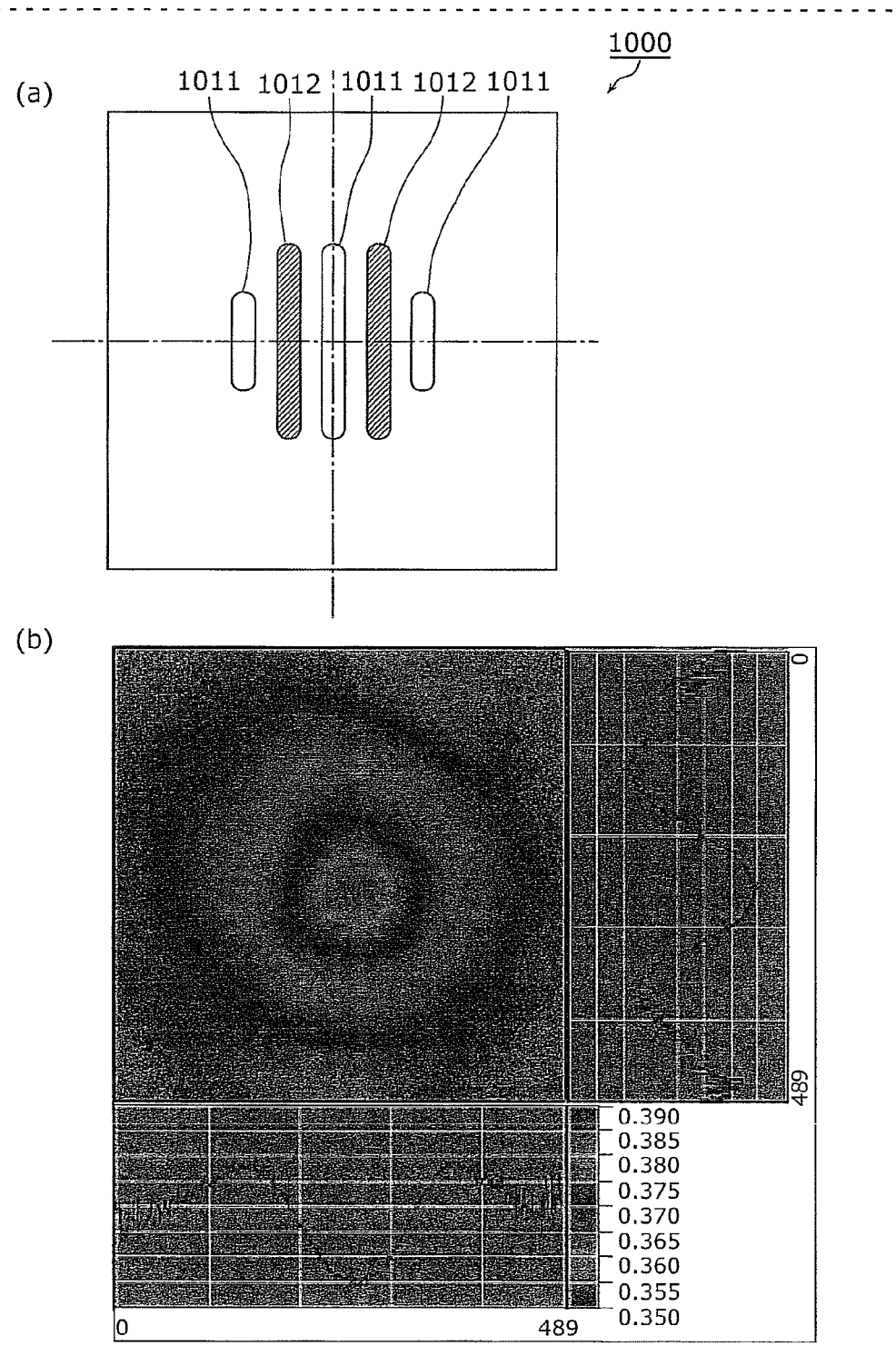

(a) in FIG. 3 is a plan view of a configuration of a light-emitting module according to a comparison example. (b) in FIG. 3 illustrates chromaticity×distribution on a surface illuminated by the light-emitting module according to the comparison example.

Figure 4:
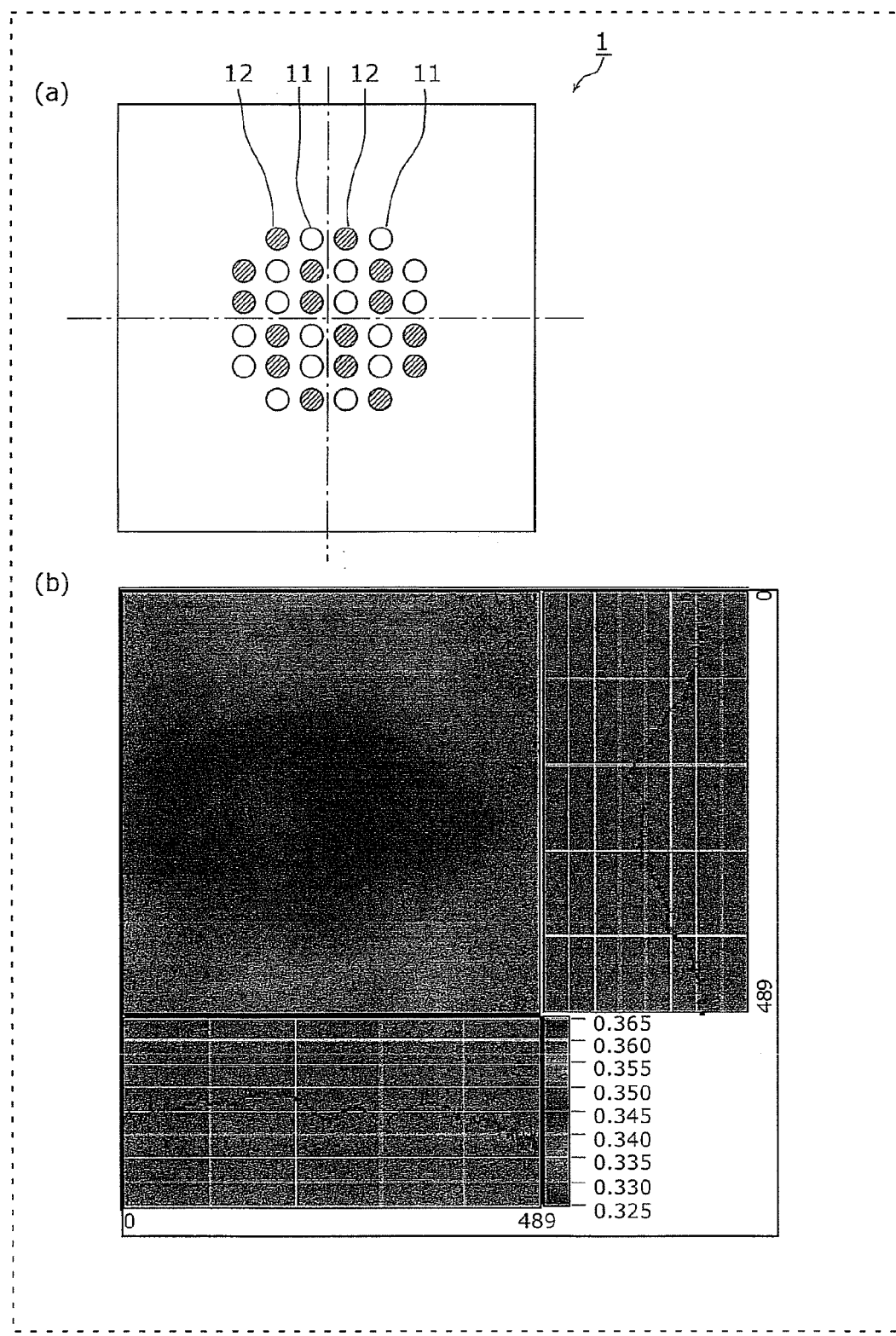

(a) in FIG. 4 is a plan view of a configuration of a light-emitting module according to an embodiment of the present invention. (b) in FIG. 4 illustrates chromaticity×distribution on a surface illuminated by the light-emitting module according to an embodiment of the present invention.

Figure 5:
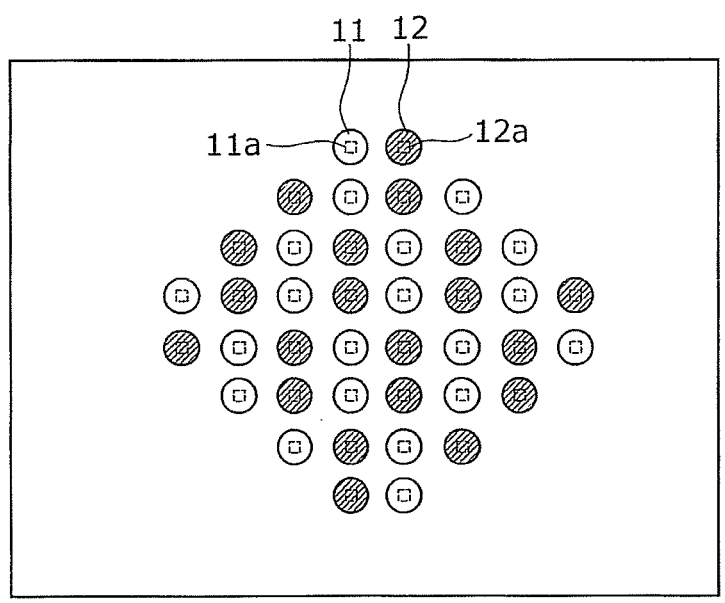

FIG. 5 is a plan view of a light-emitting module according to Variation 1 of an embodiment.

Figure 6:
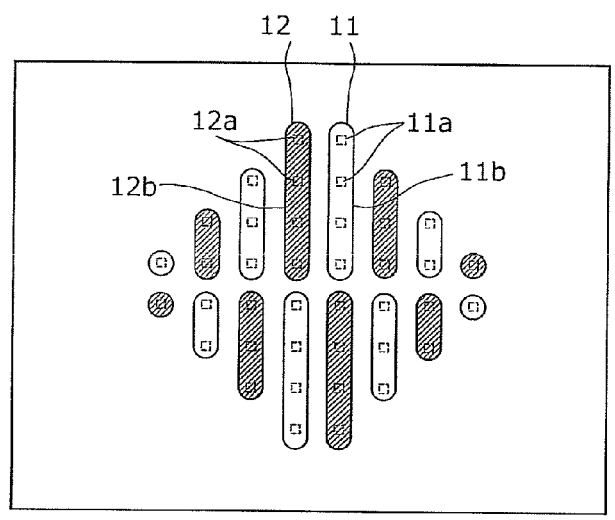

FIG. 6 is a plan view of a light-emitting module according to Variation 2 of an embodiment of the present invention.

Figure 7:
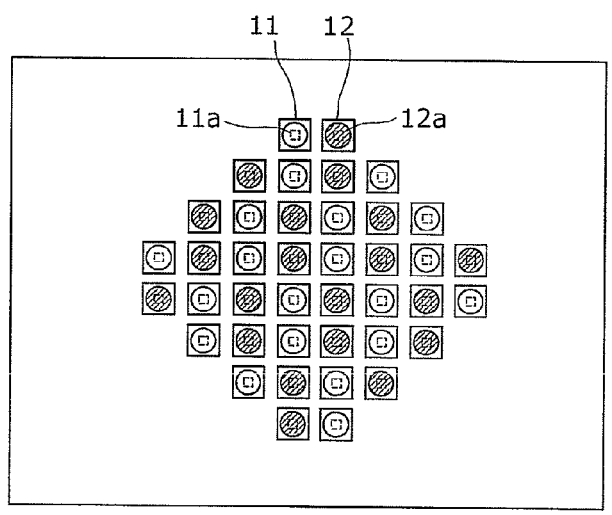

FIG. 7 is a plan view of a light-emitting module according to Variation 3 of an embodiment of the present invention.

Figure 8:
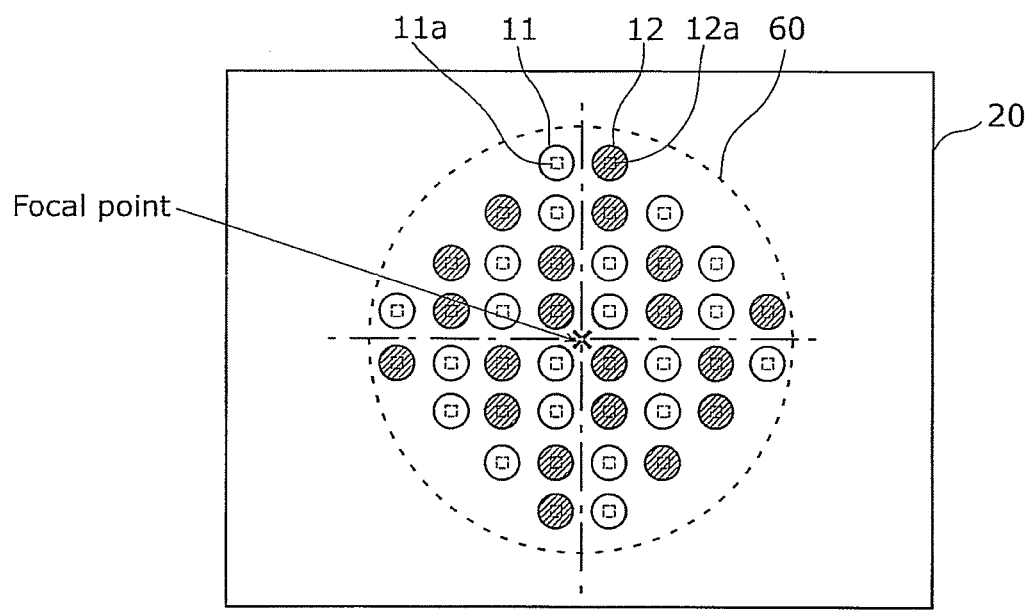

FIG. 8 is a plan view of as light-emitting module according to Variation 4 of an embodiment of the present invention.

Figure 9:
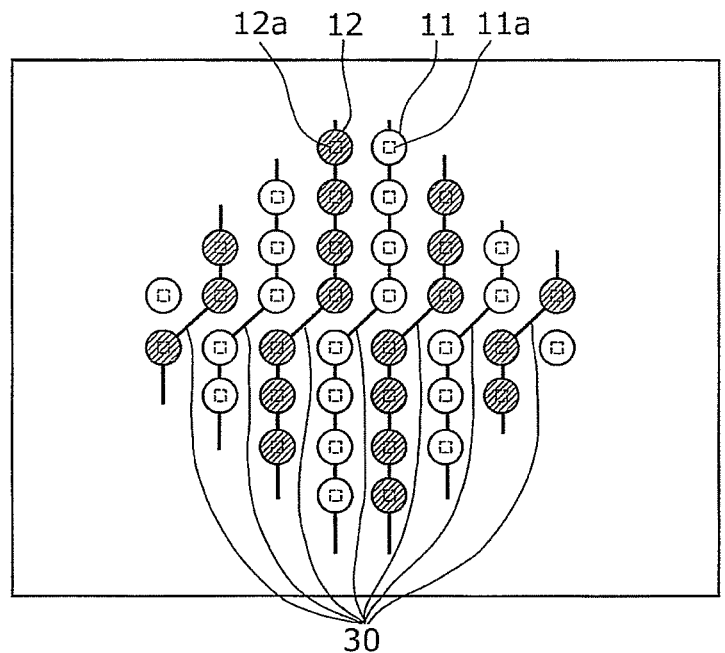

FIG. 9 is a plan view of a light-emitting module according to Variation 5 of an embodiment of the present invention.

Figure 10:
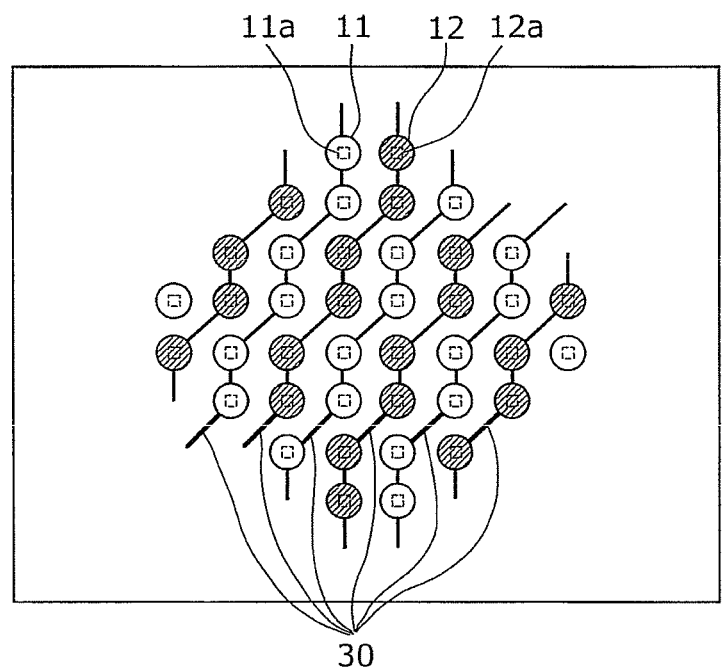

FIG. 10 is a plan view of a light-emitting module according to Variation 6 of an embodiment of the present invention.

Figure 11:
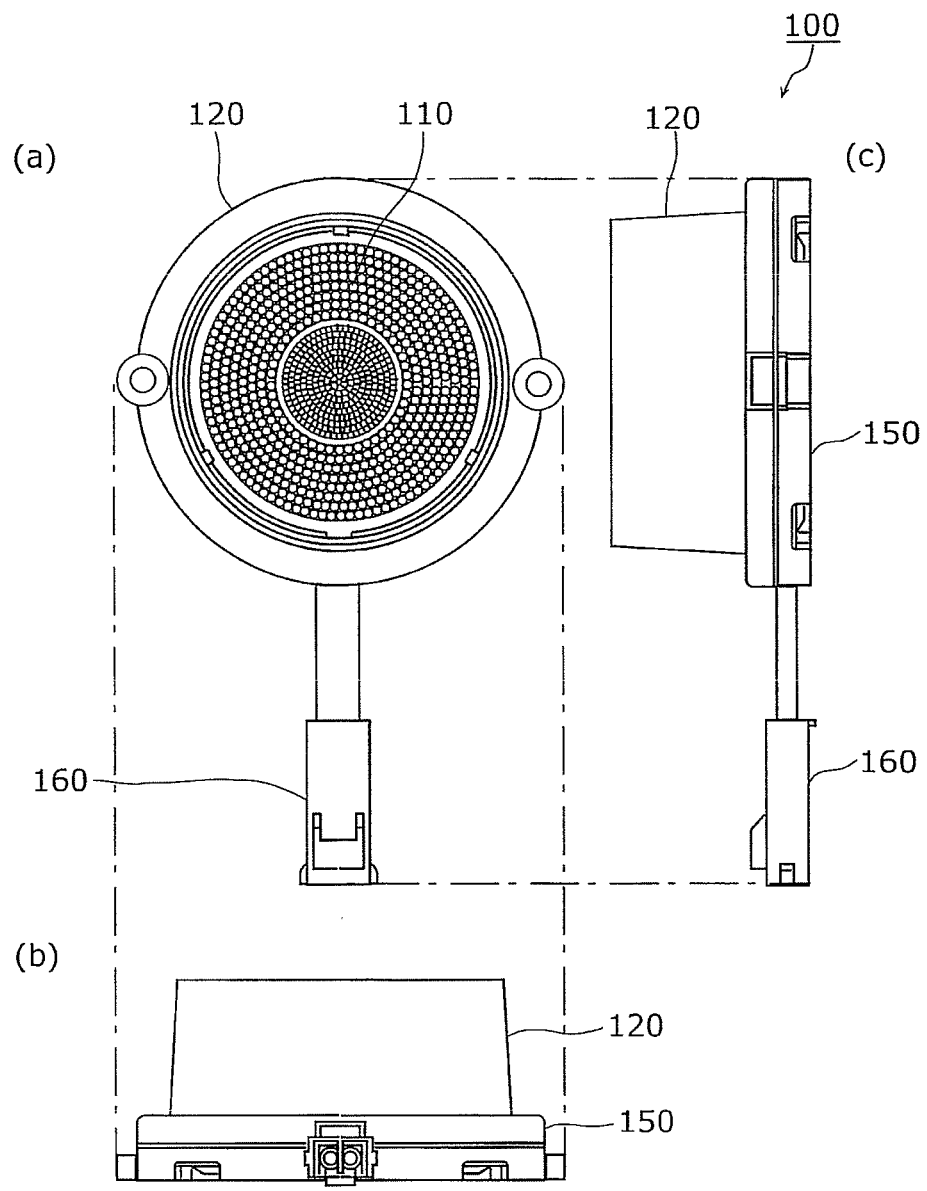

(a) in FIG. 11 is a plan view of a lighting apparatus according an embodiment of the present invention, (b) in FIG. 11 is a front view of the lighting apparatus, and (c) in FIG. 11 is a lateral view of the lighting apparatus.

Figure 12:
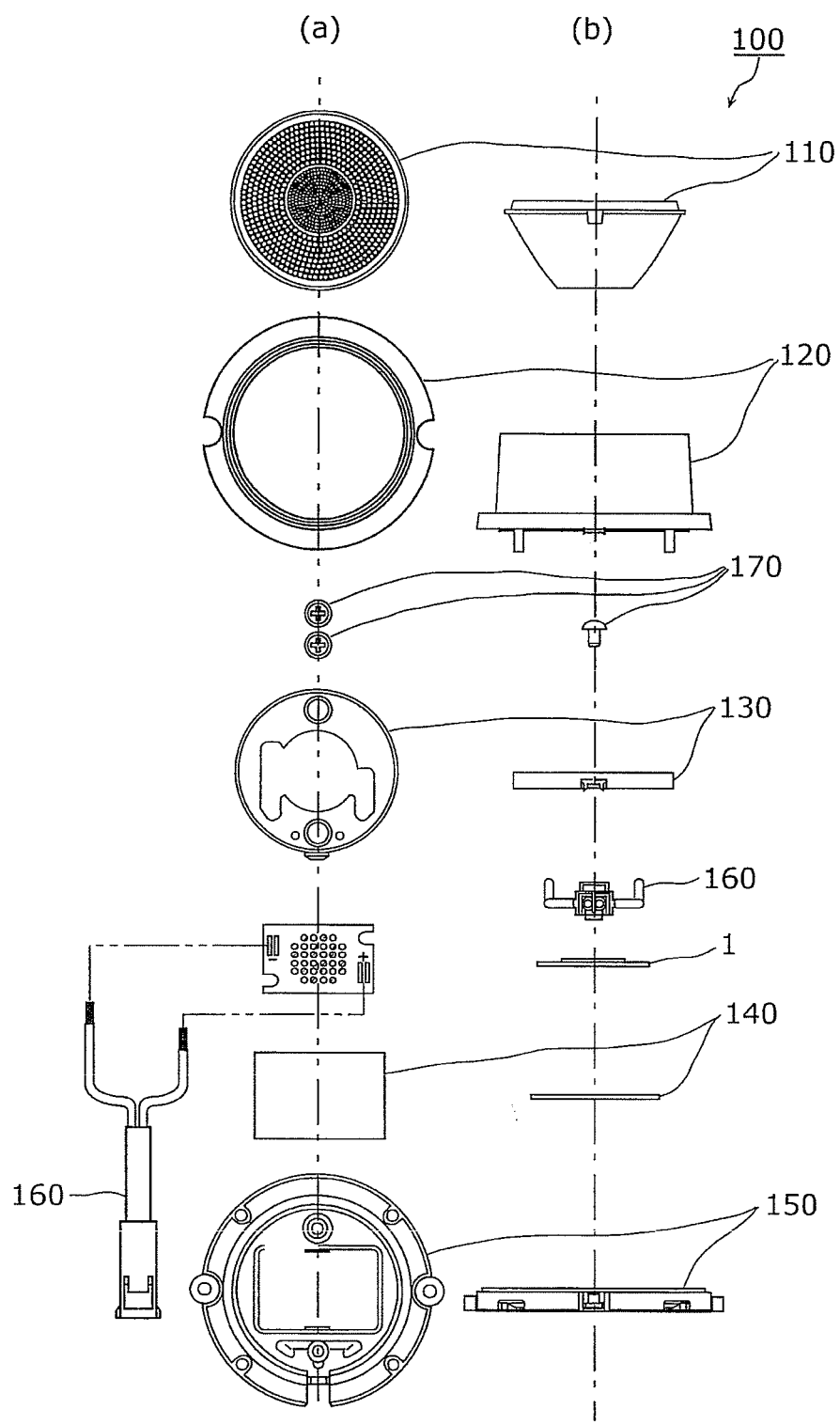

(a) in FIG. 12 is an exploded top view of a lighting apparatus according to an embodiment of the present invention, and (b) in FIG. 12 is an exploded front view of the lighting apparatus.

DETAILED DESCRIPTION

Embodiment

Hereinafter, descriptions are given of an embodiment of the present invention with reference to the drawings. It is to be noted that the embodiment described below shows a specific example of the present invention. The numerical values, shapes, materials, structural elements, the arrangement and connection of the structural elements, steps, and the processing order of the steps etc. shown in the following embodiment is a mere example, and therefore do not limit the present invention. Therefore, among the structural elements in the following embodiment, structural elements not recited in any one of the independent claims defining the most generic part of the inventive concept are described as arbitrary structural elements.

It should be noted that the Drawings are schematic drawings, and are not necessarily exact depictions. Moreover, in the Drawings, elements having the substantially same configuration share the same reference numerals. Duplicate explanations of these elements are omitted or condensed.

(Light-Emitting Module)

Figure 1:
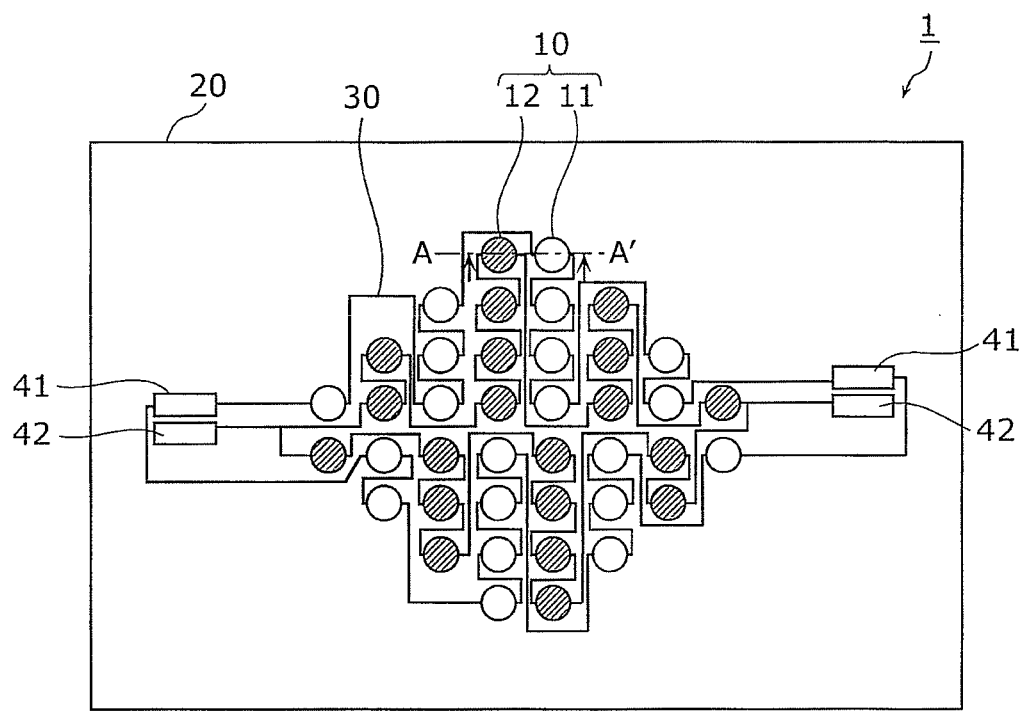
FIG. 1 is a plan view of a schematic configuration of a light-emitting module according to an embodiment of the present invention.
Figure 2:
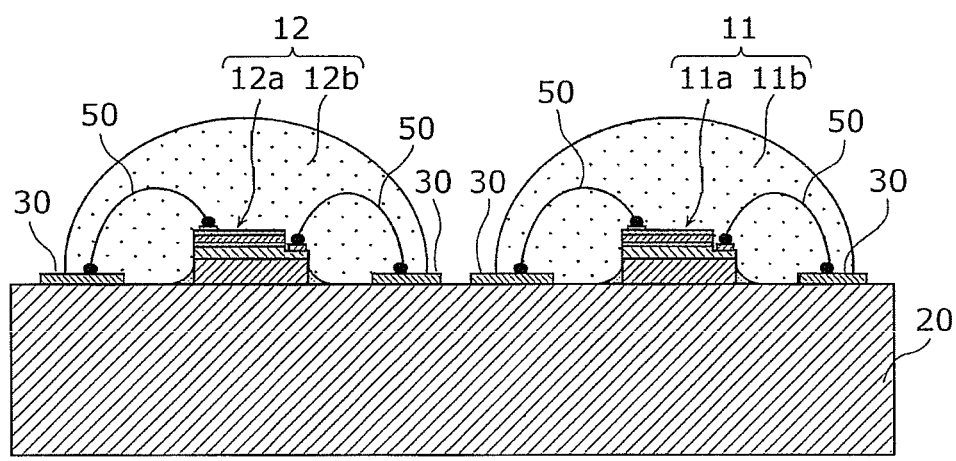
FIG. 2 is a cross-sectional view of the light-emitting module according to an embodiment of the present invention along the line A-A' in FIG. 1.

First, referring to FIG. 1 and FIG. 2, a description is given of a configuration of a light-emitting module 1 according to the embodiment. FIG. 1 is a plan view of a schematic configuration of a light-emitting module according to the embodiment. FIG. 2 is a cross-sectional view of the light-emitting module along the line A-A' in FIG. 1.

As FIG. 1 illustrates, the light-emitting module 1 is a color-adjustable light-emitting apparatus. The light-emitting module 1 includes: a board 20; and a plurality of light sources 10 arranged in a two-dimensional array on the board 20 and having a plurality of color temperatures (emission colors).

In the light-emitting module 1, the light sources 10 with a uniform color temperature are successively arranged in a first direction (vertical direction) of the two-dimensional array. The number of successively arranged light sources 10 with a uniform color temperature in each array line in the first direction is less than or equal to half of the total number of light sources 10 in the array line in the first direction.

In the embodiment, substantially hemispherical granular light sources 10 are arranged in a straight line at approximately equal intervals both in the first direction and a second direction. Here, the first direction is a vertical direction, and the second direction is a horizontal direction that is perpendicular to the first direction. The number of successively arranged light sources 10 with a uniform color temperature in each array line is less than or equal to half of the total number of light sources 10 in the array line, not only in the vertical direction but also in the horizontal direction. More specifically, the number of successively arranged light sources 10 with a uniform color temperature in each array line in the vertical and horizontal directions does not exceed half of the total number of light sources 10 in the array line.

In the embodiment, the light sources 10 include two kinds of light sources: a plurality of first light sources 11 and a plurality of second light sources 12. The first light sources 11 emit light of relatively high color temperature. The second light sources 12 emit light of relatively low color temperature. For example, the color temperature of the first light sources 11 that is a high color temperature is 8000 K, and the color temperature of the second light sources 12 that is a low color temperature is 2800 K.

The first light sources 11 are arranged such that the number of successively arranged first light sources 11 in each array line in the vertical and horizontal directions is less than or equal to half of the total number of light sources 10 in the array line. The total number of light sources 10 is a sum of the first light sources 11 and the second light sources 12 in the array line. Three or more first light sources 11 with a uniform color temperature are successively arranged only in the vertical direction.

In a similar manner, the second light sources 12 are arranged such that the number of successively arranged second light sources 12 in each array line in the vertical and horizontal directions is less than or equal to half of the total number of light sources 10 in the array line. The total number of light sources 10 is a sum of the first light sources 11 and the second light sources 12 in the array line. Three or more second light sources 12 with a uniform color temperature are successively arranged only in the vertical direction.

In the embodiment, the number of first light sources 11 in each array line is equal to the number of second light sources 12 in the array line, in both the vertical and horizontal directions. For example, in a given line in the vertical direction, if the number of first light sources 11 is four, the number of second light sources 12 is also four.

In the case where the main surface of the board 20 is sectioned into an equally pitched grid pattern (two-dimensional coordinate), the first light sources 11 and the second light sources 12 are arranged at different intersections of the grid pattern on the board 20. The intersections of the grid pattern are the points of intersection between mutually perpendicular virtual vertical lines and virtual horizontal lines.

The light-emitting module 1 further includes electrical lines 30 formed on the board 20, electrode terminals 41 and 42 electrically connected to the electrical lines 30, and wiring 50.

The light-emitting module 1 with such a configuration can adjust color of the light-emitting module 1 by adjusting the light output ratio of each of the first light sources 11 and the second light sources 12 (that is, by adjusting light).

The light-emitting module 1 according to the embodiment is a COB LED module (LED package) where LED chips are directly mounted on the board 20. Hereinafter, detailed descriptions are given of respective structural elements of the light-emitting module 1.

[First Light Sources and Second Light Sources]

The first light sources 11 and the second light sources 12 include solid-state light-emitting elements, such as LED elements, organic EL elements (OLEDs), or inorganic EL elements. In the embodiment, the first light sources 11 and the second light sources 12 are LED light sources which include LED elements. A plurality of the first light sources 11 and a plurality of the second light sources 12 are provided on the board 20. For example, as FIG. 1 illustrates, twenty first light sources 11 and twenty second light sources 12 are provided.

The first light sources 11 and the second light sources 12 can be driven independently. It is possible to perform light adjustment by varying light output of the first light sources 11 and the second light sources 12. For example, when the first light sources 11 (second light sources 12) include a plurality of LED elements, light output of the first light sources 11 (second light sources 12) can be varied by changing the number of LED elements that are caused to emit light. Alternatively, light output of the first light sources 11 (second light sources 12) can be varied by changing the amount of current that is passed to one LED element or each LED element.

As FIG. 2 illustrates, each first light source 11 has a COB structure. The first light source 11 includes an LED chip 11a and a sealing component 11b. The LED chip 11a is mounted on the board 20 at an intersection point between the vertical and horizontal directions. The sealing component 11b seals the LED chip 11a and includes a wavelength converting material which converts the wavelength of light emitted from the LED chip 11a.

In a similar manner, each second light source 12 also has a COB structure. The second light source 12 includes an LED chip 12a and a sealing component 12b. The LED chip 12a is mounted on the board 20 at an intersection point between the vertical and horizontal directions. The sealing component 12b seals the LED chip 12a and includes a wavelength converting material which converts the wavelength of light emitted from the LED chip 12a.

The LED chips 11a and 12a are one example of semiconductor light-emitting elements which emit light using a predetermined DC power. The LED chips 11a and 12a are bare chips which emit monochromatic visible light. The LED chips 11a and 12a are the same bare chips. For example, a blue LED chip which emits blue light when power passes through it can be used as each of the LED chips 11a and 12a. The blue LED chip has a main emission peak in the wavelength region of 380 nm to 500 nm, and may comprise a gallium nitride semiconductor material.

For example, each of the LED chips 11a and 12a includes: nitride semiconductor layers stacked on a sapphire substrate; and a p-side electrode and an n-side electrode on the upper surface of the stacked nitride semiconductor layers.

Each of the LED chips 11a and 12a is electrically connected to the electrical lines 30 on the board 20 via the wiring 50. For example, as FIG. 2 illustrates, the p-side electrode and the n-side electrode of each of the LED chips 11a and 12a are wire-bonded to wiring connecting portions (lands) of the electrical lines 30 by the wiring 50

The LED chips 11a and the LED chips 12a are electrically connected in a predetermined connection state by patterns of the electrical lines 30. In the embodiment, twenty LED chips 11a are mounted. Ten LED chips 11a that are serially connected form one serially connected group, and two serially connected groups are connected in parallel (10×2). In a similar manner, twenty LED chips 12a are mounted. Ten LED chips 12a that are serially connected form one serially connected group, and two serially connected groups are connected in parallel (10×2).

Each of the sealing components 11b and 12b is provided at different intersections between the vertical and horizontal directions on the board 20. The sealing components 11b and 12b are in a one to one correspondence with the LED chips 11a and 12a, respectively. Each sealing component 11b is formed on the board 20 so as to cover different one of the LED chips 11a. Each sealing component 12b is formed on the board so as to cover different one of the LED chips 12a. The LED chips 11a and 12a can be protected by being covered with the sealing components 11b and 12b, respectively.

The sealing components 11b and 12b mainly comprise a translucent material. However, when it is necessary to convert the wavelength of the light emitted from the LED chips into a predetermined wavelength as in the embodiment, a wavelength converting material is mixed into the sealing components 11b and 12b (translucent material). The sealing components 11b and 12b, for example, may comprise a resin material (phosphor-containing resin) having insulating properties. The resin material includes a phosphor as a wavelength converting material.

Silicon resin, for example, can be used as the resin material for the sealing components 11b and 12b. It may also be that the sealing components 11b and 12b include dispersion of a light diffusing material such as silica particles.

The phosphors included in the sealing components 11b and 12b are excited by the light emitted from the LED chips 11a and 12b and emit light of a desired color (wavelength). When blue LED chips are used for the LED chips 11a and 12a, yellow phosphors can be used which have a main emission peak in the wavelength region of 545 nm to 595 nm. Examples of the yellow phosphors include yttrium aluminum garnet (YAG) phosphor.

The sealing component 11b and the sealing component 12b include different kinds and different amount of phosphors. This is done so to make the color temperature (wavelength) of the light emitted from the first light source 11 (sealing component 11b) different from that of the light emitted from the second light source 12 (sealing component 12b). The sealing components 11b and 12b also have visually different colors.

The sealing components 11b and 12b according to the embodiment comprise a phosphor-containing resin that is a silicon resin dispersed with predetermined yellow phosphor particles. The sealing components 11b and 12b having a given shape can be formed by applying a phosphor-containing resin by potting or the like so as to individually seal the LED chips 11a and 12a and hardening the phosphor-containing resin. In this case, the sealing components 11b and 12b are formed to have a substantially semispherical shape. The sealing components 11b and 12b have a substantially semicircular cross-section.

As described above, each of the first light sources 11 and the second light sources 12 according to the embodiment is a B-Y type white LED light source including a blue LED chip and a yellow phosphor. In this case, a yellow phosphor absorbs a portion of the blue light emitted from the blue LED chip and is excited so that the yellow phosphor emits a yellow light. Then, the blue light not absorbed by the yellow phosphor mixes with the yellow light, which results in a white light.

In the embodiment, a description ha been given of a combination of a blue LED chip and a yellow phosphor, but the present invention is not limited to the example. For example, in order to increase color rendering properties, in addition to the yellow phosphor, a red phosphor or a green phosphor may be mixed in. Moreover, it may also be that, without using a yellow phosphor, a phosphor-containing resin including red and green phosphors is used and white light is emitted when used in combination with a blue LED chip.

[Board]

The board 20 is a base platform on which the light sources 10 are arranged. As the board 20, for example, a resin based resin board, a ceramic based ceramic board, or a metal based board may be used.

The shape of the board 20 can be appropriately selected according to the space for the board 20 in the lighting fixture, and is, for example, rectangle or circulate plate. In the embodiment, the board 20 has a rectangle shape.

[Electrical Lines]

The electrical lines 30 are electrical lines for supplying electric power to the LED chips 11a and 12a mounted on the board 20, and are formed in a given pattern on the surface of the board 20.

More specifically, the electrical lines 30 connect the LED chips 11 in series, in parallel, or in a mixture thereof, and electrically connect the LED chips 11a and the electrode terminals 41. Furthermore, the electrical lines 30 connect the LED chips 12a in series, in parallel, or in a mixture thereof, and electrically connect the LED chips 12a and the electrode terminals 42.

The electrical lines 30 comprise a conductive material such as a metal, and are, for example, metal lines such as silver lines or copper lines.

It may be that the electrical lines 30 are covered with an insulating film. In this case, examples of the insulating film include an insulating resin film such as a white resist having reflectivity and insulating properties, and a glass coat film.

[Electrode Terminals]

A pair of electrode terminals 41 is external connection terminals (connecter portions) for receiving power to be supplied to the first light sources 11 (LED chips 11a) from an external power supply (first power circuit) or the like. One of the electrode terminals 41 is a high-voltage side electrode terminal, and the other of the electrode terminals 41 is a low-voltage side electrode terminal.

In a similar manner, a pair of electrode terminals 42 is external connection terminals (connecter portions) for receiving power to be supplied to the second light sources 12 (LED chips 12a) from an external power supply (second power circuit) or the like. One of the electrode terminals 42 is a high-voltage side electrode terminal, and the other of the electrode terminals 42 is a low-voltage side electrode terminal.

Each of the electrode terminals 41 and 42 may be of a socket type including a resin socket and a conductive portion (conductive pin). Each of the electrode terminals 41 and 42 may also be a metal electrode (metal terminal) made of, for example, gold (Au) and patterned into a rectangle shape.

[Wiring]

The wiring 50 is a conductive line for electrically connecting the LED chip 11a or 12a and the electrical line 30. The wiring 50 is, for example, gold wiring. The wiring 50 is wire-bonded to the LED chip 11a or 12a and the electrical line 30.

[Functionality]

Next, referring to FIG. 3 and FIG. 4, a description is given of functionality of the light-emitting module 1 according to the embodiment. (a) in FIG. 3 is a plan view of a configuration of a light-emitting module according to a comparison example. (b) in FIG. 3 illustrates chromaticity×distribution on a surface illuminated by the light-emitting module. (a) in FIG. 4 is a plan view of a configuration of a light-emitting module according to the embodiment. (b) in FIG. 4 illustrates chromaticity×distribution on a surface illuminated by the light-emitting module.

As (a) in FIG. 3 illustrates, a light-emitting module 1000 according to a comparison example includes first line light sources 1011 having a relatively high color temperature, and second line light sources 1012 having a relatively low color temperature. Each of the first line light sources 1011 and the second line light sources 1012 is formed by collectively sealing LED chips arranged in a line with a phosphor-containing resin formed in a line.

The color temperature of the first line light sources 1011 is 8000 K, and the color temperature of the second line light source 1012 is 2800 K. The first line light sources 1011 and the second line light sources 1012 are alternately formed.

The light-emitting module 1000 according to the comparison example with such a configuration is likely to have color unevenness. In particular, providing, in the light-emitting side of the first line light sources 1011 and the second line light sources 1012, an optical component for focusing light causes ring-shaped color unevenness on the illuminated surface, as illustrated in (b) in FIG. 3. In this case, the difference Δx between the maximum value and the minimum value in the chromaticity×distribution on the illuminated surface is 0.025.

In contrast, in the light-emitting module 1 according to the embodiment illustrated in (a) in FIG. 4, providing an optical component, for focusing light, in the light-emitting side of the first light sources 11 and the second light sources 12 causes reduced color unevenness as illustrated in (b) in FIG. 4. The reduced color unevenness is achieved as a result of mixture of the colors of the light emitted from the first light sources 11 and the second light sources 12. In this case, the difference Δx between the maximum value and the minimum value in the chromaticity×distribution on the illuminated surface is 0.015, which is smaller than that of the light-emitting module 1000 according to the comparison example.

According to the light-emitting module 1 in the embodiment, the light sources 10 arranged in the vertical or horizontal direction partially include the light sources 10 having a uniform color temperature that are successively arranged. The number of successively arranged light sources 10 with a uniform color temperature in each array line in the vertical or horizontal direction is less than or equal to half of the total number of light sources 10 in the array line. More specifically, in the vertical or horizontal direction, the number of light sources 10 with a uniform color temperature that are successively arranged in each array line does not exceed half of the total number of light sources 10 in the array line.

This allows the arrangement of the light sources 10 to be non-axisymmetric, which facilitates mixture of the light emitted from the light sources 10 having different color temperatures. As a result, it is possible to reduce color unevenness.

Furthermore, in the embodiment, in both the vertical and horizontal directions, the number of light sources 10 with a uniform color temperature that are successively arranged in each array line is less than or equal to half of the total number of light sources 10 in the array line.

Such an arrangement can further reduce color unevenness compared with the case where, only in one of the vertical and horizontal directions, the number of light sources 10 with a uniform color temperature that are successively arranged in each array line is less than or equal to half of the total number of light sources 10 in the array line.

Furthermore, in the embodiment, the number of successively arranged light sources 10 with a uniform color temperature in the vertical direction and in the horizontal direction is four or less, but it may be two at most. For example, as FIG. 5 illustrates, it may be that the number of successively arranged first light sources 11 and the number of successively arranged second light sources 12 in each array line in the vertical and horizontal directions is two at most.

With this, compared with the configuration illustrated in FIG. 1, the colors of the light emitted from the first light sources 11 and the second light sources 12 are more easily mixed. As a result, it is possible to further reduce color unevenness.

In the embodiment, each of the LED chips 11a and 12a is individually sealed by the sealing component 11b and 12b, respectively, but the present invention is not limited to the example. For example, as FIG. 6 illustrates, the LED chips 11a and the LED chips 12a arranged in lines may be collectively sealed by the sealing components 11b and 12b respectively formed along the LED chips 11a and 12a. In other words, the first light sources 11 and the second light sources 12 may partially be formed as line light sources.

In this case, too, it may be that, in the vertical and horizontal directions, the number of successively arranged first light sources 11 (one in FIG. 6) and the number of successively arranged second light sources 12 (one in FIG. 6) in each array line is less than or equal to half of the total number of the first light sources 11 and the second light sources 12 (two in FIG. 6) in the array line.

With such an arrangement, even when the first light sources 11 and the second light sources 12 are formed as line light sources, line light sources in each line includes the first line source 11 and the second line source 12. Hence, compared to the light-emitting module 1000 according to the comparison example in FIG. 3, color unevenness can be further reduced.

Furthermore, in the embodiment, the light sources 10 (the first light sources 11 and the second line sources 12) have a COB structure, but may have a SMD structure as illustrated in FIG. 7. For example, as the first light source 11 (second light source 12), a package type LED element can be used. The package type LED element includes a container (package) such as a white resin having a cavity, the LED chip 11a (12a) mounted in the cavity in the container, and a phosphor-containing resin filled in the cavity.

However, the light sources 10 (first light sources 11 and second light sources 12) with a COB structure as illustrated in FIG. 1 facilitates mixture of the colors of the light emitted from adjacent light sources 10, so that color unevenness can be further reduced.

Moreover, in the embodiment, the first light sources 11 and the second light sources 12 are provided at equal intervals at different intersections between the vertical and horizontal directions.

With this, the colors of the light emitted from the first light sources and the second light sources 12 can be evenly mixed, so that color unevenness can be effectively reduced.

Moreover, in the embodiment, a lens 60 may be provided for focusing the light emitted from the light sources 10. In this case, as FIG. 8 illustrates, for example, the light sources 10 (first light sources 11 and second light sources 12) are not provided at the focal point of the lens on the board 20.

With such an arrangement, none of the LED chips 11a (12a) and the sealing components 11b (12b) including phosphors are present at the focal point of the lens 60. Hence, the color of the light emitted along the optical axis of 0 degrees is not monochromatic. This facilitates mixture of the colors of the light emitted from the first light sources 11 and the second light sources 12, allowing further reduction in color unevenness.

Moreover, in the embodiment, it may be that the electrical lines 30 are inclined in the same direction to connect the light sources having a uniform color temperature and belonging to different array lines. For example, as FIG. 9 and FIG. 10 illustrate, it may be that the electrical lines 30 are patterned such that the electrical lines 30 connecting the first light sources 11 or the electrical lines 30 connecting the second light sources 12 are partially inclined in the same direction.

With such an arrangement, two or more electrical lines 30 are not patterned between the first light sources 11 (LED chips 11a) or between the second light sources 12 (LED chips 12a). In addition, a jumper resistor is not necessary. Hence, the distance between the adjacent LED chips 11a (or between the adjacent LED chips 12a) can be reduced. As a result, the entire region where the light sources 10 are arranged (light-emitting region) can be reduced. Hence, the size of a fixture in which the light-emitting module 1 is placed can be reduced, leading to a lower cost for the fixture. Moreover, with the reduced light-emitting region, desired performance (light focusing performance) can be obtained even with reduced diameter of the optical component (lens 60) (diameter of lens). This lead to reduction in cost for the optical component.

(Lighting Apparatus)

Next, referring to FIG. 11 and FIG. 12, a description is given of a configuration of a lighting apparatus 100 according to the embodiment. FIG. 11 illustrates a plan view, a front view, and a lateral view of the lighting apparatus according to the embodiment. FIG. 12 illustrates an exploded top view and an exploded front view of the lighting apparatus according to the embodiment.

As FIG. 11 and FIG. 12 illustrate, the lighting apparatus 100 is, for example, a recessed light installed in a ceiling or the like. The lighting apparatus 100 includes an LED module (LED package) 1, a lens 110, a case 120, an LED holder 130, a heat dissipating sheet 140, a base plate 150, a connector line 160, and a screw 170.

The lens 110 is an optical component for focusing light emitted from the light-emitting module 1, and is fitted into the case 120 and fixed.

The case 120 is a substantially cylindrical frame component, and houses the light-emitting module 1 held by the base plate 150 and the LED holder 130, and the lens 110. The case 120 is fixed to the base plate 150.

The LED holder 130 is a holding component for holding the light-emitting module 1, and fixes the light-emitting module 1 such that the light-emitting module 1 is pressed onto the base plate 150. The LED holder 130 is screwed to the base plate 150 by the screw 170.

The heat dissipating sheet 140 is a heat conducting sheet for dissipating, via the base plate 150, heat generated by the light-emitting module 1.

The base plate 150 is a support base for supporting the light-emitting module 1 and the case 120. The base plate 150 also functions as a heat sink for dissipating heat generated by the light-emitting module 1. As such, the base plate 150 may comprise a metal material such as aluminum or a resin material having a high rate of heat transfer.

The connector line 160 is a supply line for supplying DC power from an external power supply (power circuit) to the light-emitting module 1. The connector line 160 includes a lead line for supplying low-voltage side power and a lead line for supplying high-voltage side power. These leads are covered with tubes having insulating properties. At one end of the connector line 160, the leads exposed from the tubes are connected with the electrode terminals 41 and 42 of the light-emitting module 1. At the other end of the connector line 160, a connecting socket for connecting to the external power supply is provided.

As described above, since the lighting apparatus 100 according to the embodiment includes the light-emitting module 1 according to the embodiment, color unevenness can be reduced.

Other Variations

Although descriptions have been given of the light-emitting module and the lighting apparatus according to the present invention based on the above embodiment, the present invention is not limited to the embodiment.

For example, in the embodiment, in both the vertical and horizontal directions, the number of light sources 10 having a uniform color temperature and arranged successively in each array line is less than or equal to half of the total number of light sources 10 in the array line. The present invention, however, is not limited to the example. More specifically, the number of successively arranged light sources 10 with a uniform color temperature in each array line may be less than or equal to half of the total number of light sources 10 in the array line in a diagonal direction in addition to the vertical and horizontal directions. The diagonal direction is, for example, a direction of 45 degrees relative to the vertical and horizontal directions. It may be that in at least one of the vertical, horizontal, and diagonal directions, the number of light sources 10 having a uniform color temperature and successively arranged in each array line is less than or equal to half of the total number of light sources 10 in the array line.

For example, in the embodiment, the color temperatures of the light-emitting module 1 is not limited to two color temperatures (two kinds), but may be three color temperatures (three kinds) or more.

Moreover, in the embodiment, a plurality of first light sources 11 and a plurality of second light sources 12 are provided. However, it may be that at least one first light source 11 and at least one second light source 12 are provided.

Moreover, in the embodiment, the LED chip 11a (12a) is sealed with the sealing component 11b (12b) including a wavelength converting material (phosphor), but the present invention is not limited to the example. For example, a sealing component including no wavelength converting material may be used, or no sealing component may be used. In this case, it may be that a plurality of LED chips having different color temperatures are used.

Moreover, in the embodiment, a description has been given of an example where the light-emitting module 1 is applied to the recessed light, but the present invention is not limited to the example. For example, the light-emitting module 1 can also be applied to other lighting apparatuses and lamps such as a base light, a spot light, a bulb-shaped lamp, and a straight tube lamp. In addition, the light-emitting module 1 can also be applied to apparatuses other than lighting apparatus.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A light-emitting module comprising:
a board;
a plurality of light sources arranged in a two-dimensional array on the board, each of the light sources having either a first color temperature or a second color temperature of a white light, and
a plurality of electrical lines for connecting light sources that have a uniform color temperature
wherein among the plurality of light sources, light sources having a uniform color temperature are successively arranged in an array line extending in a first direction of the two-dimensional array,
the electrical lines connect light sources that belong to different array lines, and are inclined in a same direction in a planar view of the board, the inclined electrical lines reduce distances between adjacent light sources of different array lines and
a number of the light sources having a uniform color temperature and successively arranged in each array line in the first direction is less than or equal to half of a total number of light sources arranged in the each array line in the first direction.

2. The light-emitting module according to claim 1,
wherein a number of light sources having a uniform color temperature and successively arranged in each array line in a second direction of the two-dimensional array is less than or equal to a half of a total number of light sources arranged in the each array line in the second direction, the second direction being perpendicular to the first direction.

3. The light-emitting module according to claim 2,
wherein among the plurality of light sources, three or more light sources having a uniform color temperature are successively arranged only in the first direction.

4. The light-emitting module according to claim 2,
wherein the number of the light sources having a uniform color temperature and successively arranged in each of the first direction and in the second direction is at most two.

5. The light-emitting module according to claim 1,
wherein each of the plurality of light sources includes:
a solid-state light-emitting element mounted at an intersection between a vertical direction and a horizontal direction of the two-dimensional array; and
a sealing component which seals the solid-state light-emitting element and includes a wavelength converting material for converting a wavelength of light emitted from the solid-state light-emitting element.

6. The light-emitting module according to claim 5,
wherein the sealing component is provided at the intersection in one-to-one correspondence with the solid-state light-emitting element.

7. The light-emitting module according to claim 5,
wherein the solid-state light-emitting device is mounted at a portion other than a center of a light-emitting region, the light-emitting region being an entire region including all of the plurality of light sources.

8. The light-emitting module according to claim 5, further comprising
a lens for focusing light emitted from the plurality of light sources,
wherein none of the plurality of light sources is arranged at a focal point of the lens.

9. A lighting apparatus comprising
the light-emitting module according to claim 1.

10. The light-emitting module according to claim 1, wherein a first set of light sources having the first color temperature are adjacently aligned with one another in the first direction, and a second set of light sources having the second color temperature are adjacently aligned with one another in the first direction.

11. The light-emitting module according to claim 10, wherein the first set of light sources are alternately arranged with the second set of light sources in the first direction.

12. The light-emitting module according to claim 11, wherein the first set of light sources and the second set of light sources are alternately arranged in a same array line.

\* \* \* \* \*